United States Patent
Casper

(10) Patent No.: US 6,184,067 B1
(45) Date of Patent: *Feb. 6, 2001

(54) MEMORY DEVICE WITH MULTIPLE INPUT/OUTPUT CONNECTIONS

(75) Inventor: Stephen L. Casper, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/067,359

(22) Filed: Apr. 27, 1998

Related U.S. Application Data

(63) Continuation of application No. 08/660,109, filed on Jun. 7, 1996, now Pat. No. 5,744,870.

(51) Int. Cl.⁷ .................................................. H01L 21/44
(52) U.S. Cl. ........................ 438/123; 438/111; 438/129
(58) Field of Search ................................. 257/203, 666, 257/690, 773, 784, 786, 672; 438/129, 123, 106, 110, 111, 112

(56) References Cited

U.S. PATENT DOCUMENTS

| | | | |
|---|---|---|---|
| 4,733,288 | * 3/1988 | Sato | 257/268 |
| 4,930,000 | * 5/1990 | Kantz | 257/786 |
| 4,945,395 | * 7/1990 | Suehiro | 257/203 |
| 5,066,999 | 11/1991 | Casper | 257/786 |
| 5,073,816 | 12/1991 | Wakefield et al. | 257/724 |
| 5,208,782 | 5/1993 | Sakuta et al. | 365/230.03 |
| 5,233,220 | 8/1993 | Lamson et al. | 257/666 |
| 5,359,224 | 10/1994 | Heinen et al. | 257/666 |
| 5,587,607 | 12/1996 | Yasuda et al. | 257/690 |
| 5,627,792 | * 5/1997 | Tsujimoto | 365/230.05 |

* cited by examiner

Primary Examiner—Olik Chaudhuri
Assistant Examiner—Alonzo Chambliss
(74) Attorney, Agent, or Firm—Schwegman, Lundberg, Woessner & Kluth, P.A.

(57) ABSTRACT

A memory device is described which is fabricated as an integrated circuit and uses distributed bond pads for electrical connection to an external conductive lead. The distributed bond pads are attached to a external lead, thereby eliminating bus lines on the integrated circuit memory. Distributed buffer circuits are described which can be included with the distributed bond pads to increase data communication time between the memory device and an external processor.

10 Claims, 5 Drawing Sheets

MEMORY DEVICE WITH MULTIPLE INPUT/OUTPUT CONNECTIONS

CROSS REFERENCE TO RELATED APPLICATION

This application is a continuation of application Ser. No. 08/660,109, filed Jun. 7, 1996, now U.S. Pat. No. 5,744,870 which is incorporated herein by reference.

TECHNICAL FIELD OF THE INVENTION

The present invention relates generally to memory devices and in particular the present invention relates to integrated circuit memory devices having multiple data communication connections.

BACKGROUND OF THE INVENTION

Packaged integrated circuit memory devices typically include a semiconductor die or chip which is encapsulated in plastic. The integrated circuit chip is connected to a printed circuit board through electrical conductors called leads. During manufacturing, all leads are typically connected together in what is referred to as a lead frame. The lead frame is electrically attached to the die using thin wire, typically made of gold, which is bonded to both the lead frame and bond pads provided on the chip surface. The chip and a portion of the lead frame is then encapsulated in plastic and the interconnections of the various conductors of the lead frame are removed to leave independent, electrically isolated leads.

It is known to those skilled in the art that multiple bond pads or multiple bond wires can be used to attach power and ground leads to an integrated circuit. These arrangements can be used to simplify power distribution throughout the integrated circuit. In contrast, only one bond pad is provided for each data lead of the memory device. Thus, multiple lengthy conductors are provided on the die if several circuits located remotely on the die must be connected to a common lead. These conductors reduce the operating efficiency of the memory and require available real estate Further, data communication connections (DQ's) use a single input/output buffer circuit in conjunction with each bond pad to which the multiple conductors are connected. The single buffer and the long conductors in combination increase the complexity of the die and reduce the operating time efficiency of the memory device.

For the reasons stated above, and for other reasons stated below which will become apparent to those skilled in the art upon reading and understanding the present specification, there is a need in the art for a memory device which eliminates the need for data communication paths on an integrated circuit die from multiple remote circuits to a common data buffer and bond pad.

SUMMARY OF THE INVENTION

The above-mentioned problems with integrated circuit memories and other problems are addressed by the present invention and which will be understood by reading and studying the following specification. A memory device is described which uses distributed input/output buffers and multiple bond pads for data communication connections.

In particular, the present invention describes an integrated circuit memory device comprising an integrated memory die having multiple bond attachment pads, and a conductive leads connected to the bond attachment pads such that some of the conductive leads are connected to more than one bond attachment pad.

In another embodiment a memory device is described which comprises a plurality of conductive leads, and an integrated circuit memory chip. The memory chip comprises an array of memory cells arranged in subarrays, bond pads fabricated on the integrated circuit memory chip and electrically coupled to the subarrays, the bond pads are electrically connected to the conductive leads such that the bond pads are connected to one of the conductive leads.

A method of reducing data communication time in an integrated memory circuit is described. The method comprises the steps of fabricating an integrated memory circuit on a semiconductor die having bi-directional data communication circuits coupled to a plurality bond pads distributed over the die, providing a lead frame having an electrically conductive lead for bonding to the distributed bond pads, and bonding the bond pads to the electrically conductive lead for bi-directional data communication with an external processor.

In yet another embodiment, a bi-directional data communication system is described. The system comprises a processing unit, and a memory device connected to the processing unit through data communication connections. The data communication connections comprise electrically conductive leads. The memory device is fabricated as a semiconductor die and comprises an array of memory cells arranged in a plurality of subarrays, a plurality of bond pads fabricated on the integrated circuit memory chip and electrically coupled to the plurality of subarrays. The plurality of bond pads are electrically connected to the plurality of conductive leads such that a plurality of bond pads are connected to each one of the plurality of conductive leads.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
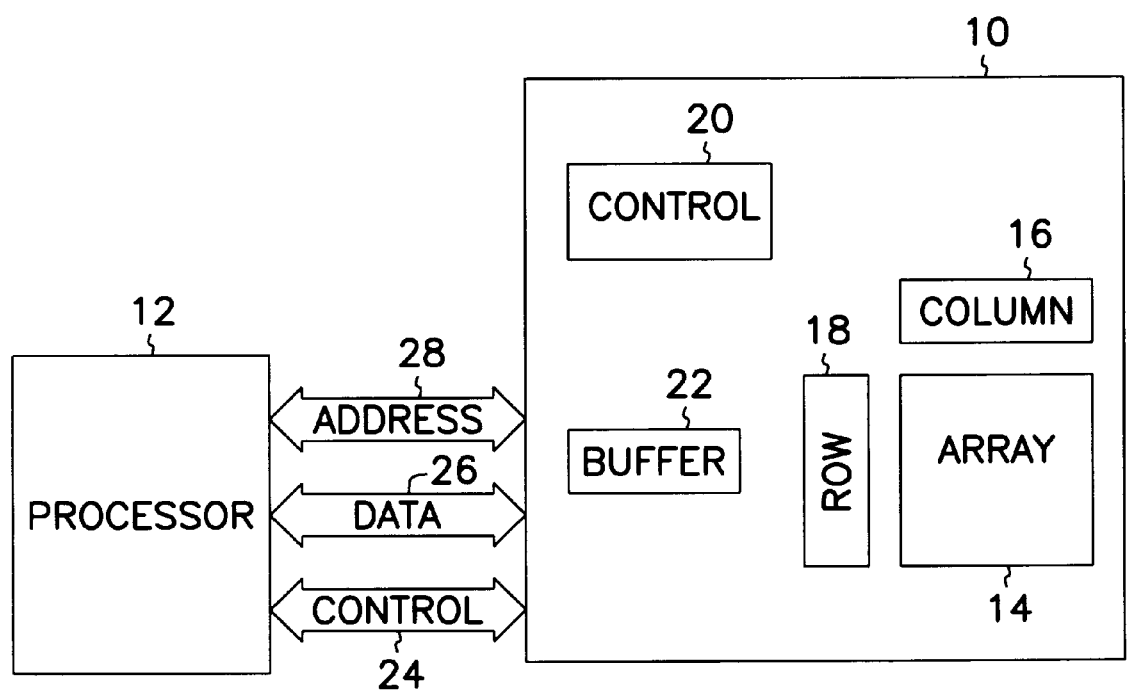
FIG. 1 is a diagram of a block diagram of a DRAM incorporating the present invention.

FIG. 1 illustrates a simplified block diagram of a DRAM 10. The memory device can be coupled to a processor 12 such as a microprocessor of a personal computer. The memory device 10 includes a memory array 14 having rows and columns of memory cells. Column decoder 16 and row decoder 18 are provided to access the memory array in response to address signals provided by the processor 12 on address communication lines 28. Data communication is conducted via I/O buffer circuitry 22 and bi-directional data communication lines 26 (DQ). Internal control circuitry 20 accesses the memory array in response to commands provided by the processor 12 on control lines 24. The control lines can include Row Address strobe (RAS*), Column Address Strobe (CAS*), Write Enable (WE*), and Output Enable (OE*). It will be appreciated by those skilled in the art that the present invention is equally applicable to other types of memory devices including, but not limited to, SRAM, SDRAM, EDO, Burst EDO, and VRAM.

Figure 2:
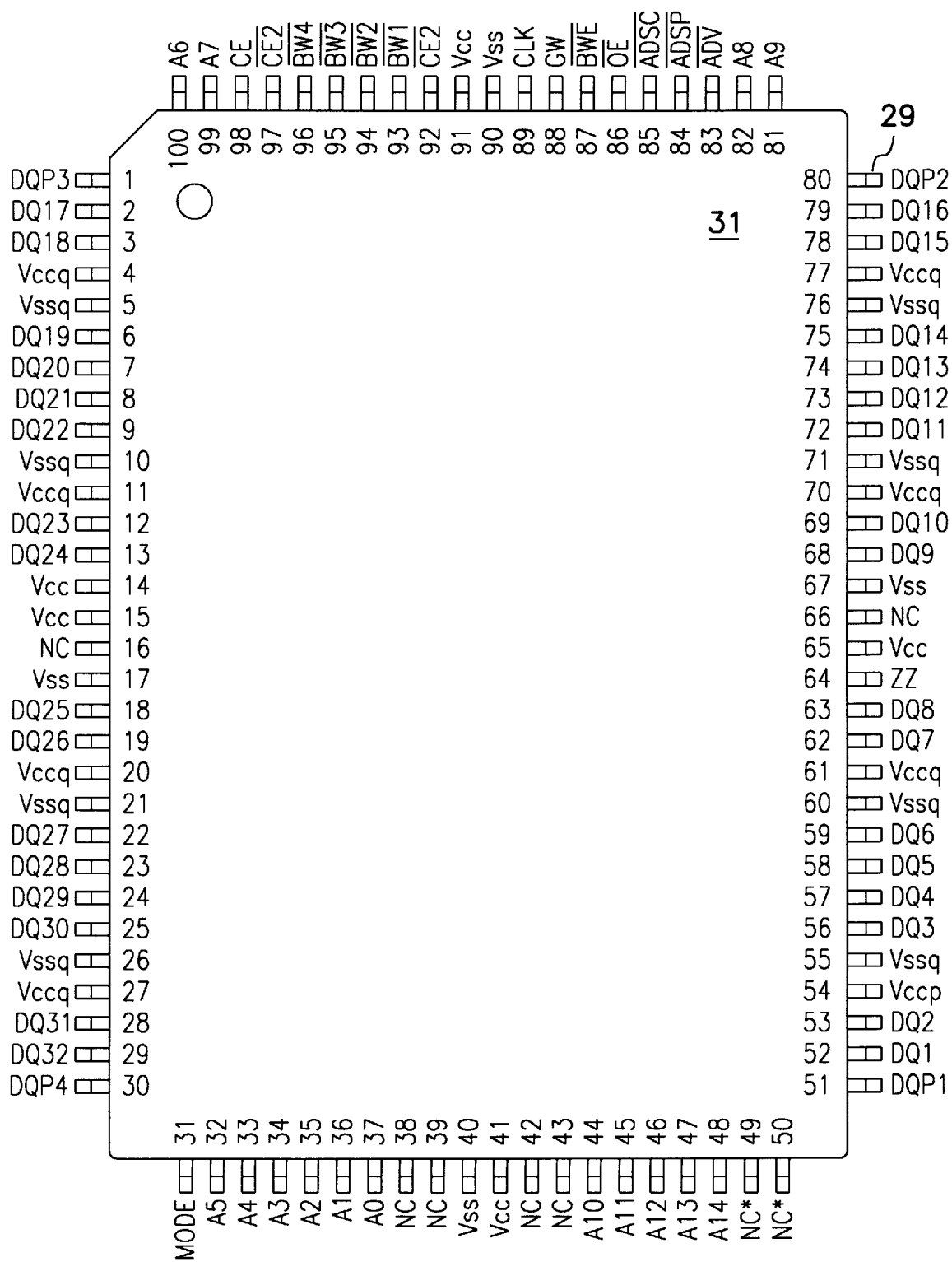
FIG. 2 is a diagram of a packaged SRAM memory.

FIG. 2 shows a top view of an integrated circuit package 31 of a 32 k by 36 SRAM circuit memory device. The packaged memory has metal leads 29 (pins) provided for external connections. The metal connections are typically fabricated as a lead frame which is electrically bonded to the integrated circuit. The lead frame and memory circuit is enclosed to protect the circuit and bond connections from environmental contaminates. As stated above, plastic is a preferred material for use in enclosing the memory device.

Figure 3:
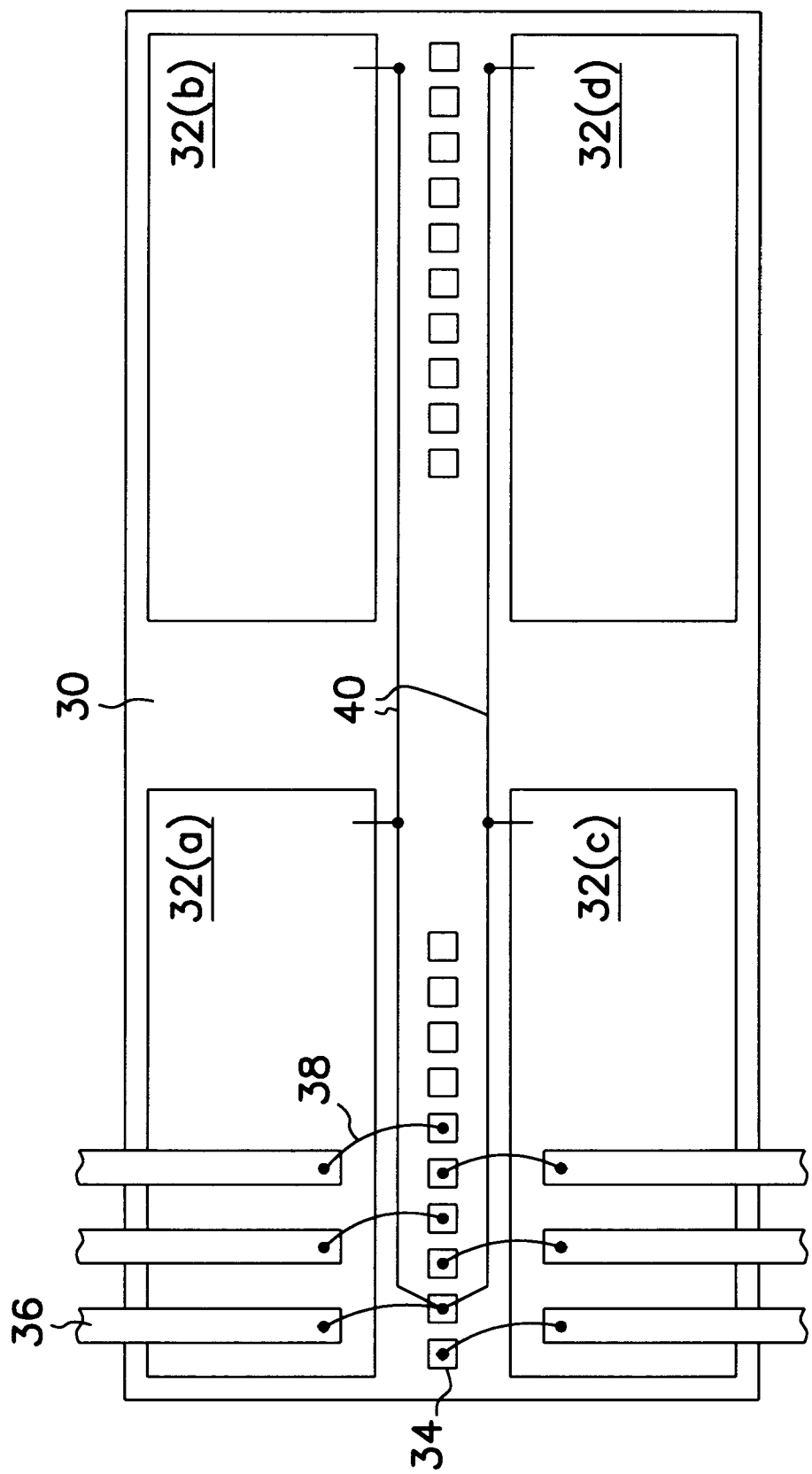
FIG. 3 is a diagram of a prior art memory chip and lead frame.

FIG. 3 illustrates an integrated circuit memory die attached to a lead frame. The lead frame is only partially illustrated to show some of the lead frame connections used to bond to the integrated circuit die. It will be appreciated that any number of lead frame connections can be used for a memory circuit and are limited only by the physical constraints of the memory package. The lead frame 36 is connected to the memory die 30 through bond wires 38 which are attached to bond pads 34 provided on the die. The memory die is fabricated with a memory array divided into four array subsections 32(a)–(d). Each subsection is connected to each data pin (DQ).

When multiple circuit locations need to be attached to one lead frame connection, a conductive path is fabricated on the die. This path is preferably a layer of metal deposited on the die, however, polysilicon can be used. Because the memory cells are arranged in an array covering a substantial portion of the die, data communication between the external controller and the memory device is typically performed via data bus paths 40. The data bus paths are susceptible to parasitic capacitance which can significantly increase time delays experienced in data communication. Input/Output buffer circuits are typically provided for each data communication bond pad. The data bus paths, therefore, are routed through the buffer circuitry.

Distributed Bond Pads and I/O Buffers

Figure 4:
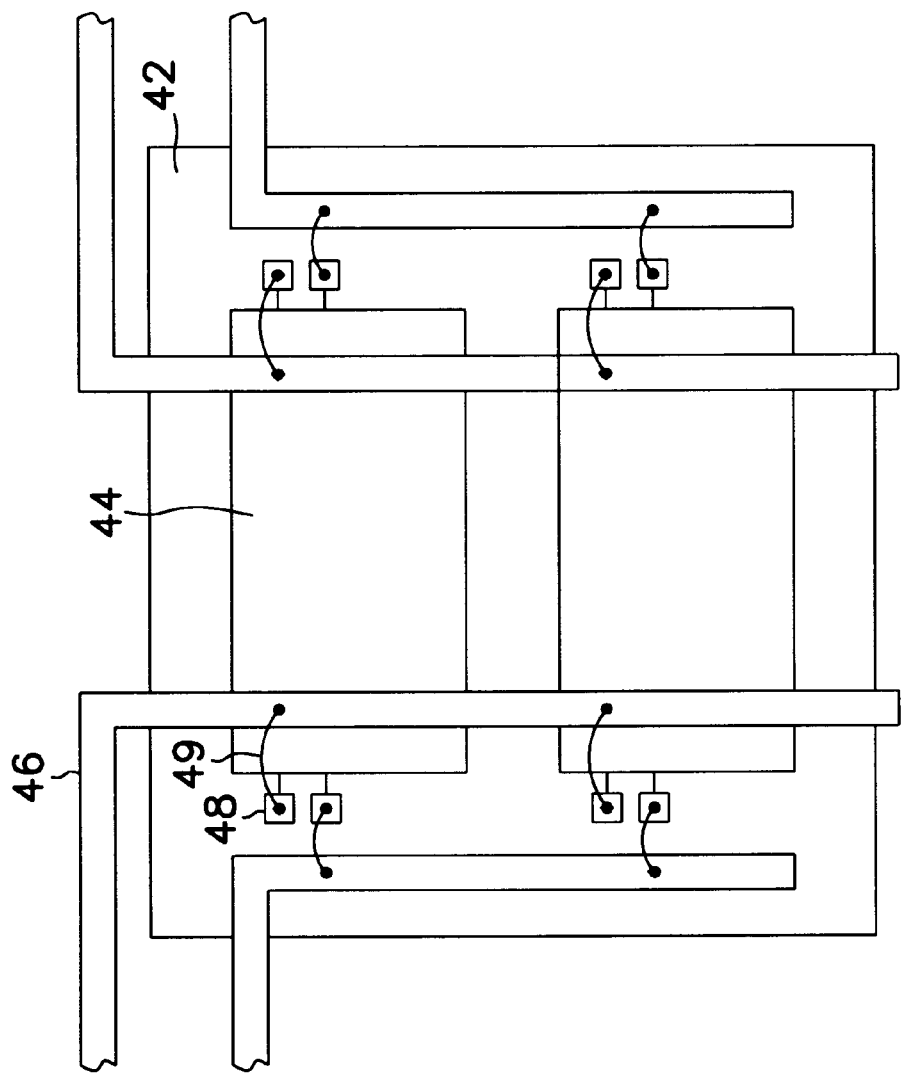
FIG. 4 is a diagram of a memory chip and lead frame of the present invention.

FIG. 4 illustrates a memory device which uses distributed data bond pads to reduce time delays in data communication. Further, the complexity and die size of the integrated circuit is reduced. The memory device can be a dynamic random access memory (DRAM), a static RAM, or any other type of memory device. The memory device eliminates the need for data bus paths by using extended lead connections which traverse the integrate d circuit die to receive multiple bond wires. This structure increases data communication speed between the memory array and the external processor by reducing the parasitic capacitance in the data path. It will be recognized that multiple bond pads can be provided for all data communication lines (DQ's) or provided for select DQ lines which are determined to be most susceptible to delays.

The integrated memory die 42 is fabricated with a memory cell array divided into sub-array sections 44. Bond pads 48 are provided adjacent the sub-arrays for connection to the lead frame legs 46 by connection 49. The lead frame legs are bonded to multiple bond pads for electrical communication with the memory die. The data bus lines 40 of FIG. 3 are eliminated by using the extended leads and multiple bond pads. It will be appreciated by those skilled in the art that input/output buffer circuitry will be included for each bond pad. Thus, additional circuitry is needed for the distributed bond pad memory device. The additional real estate needed for the buffer circuitry, however, is more than offset by the reduction of bus lines.

Figure 5:
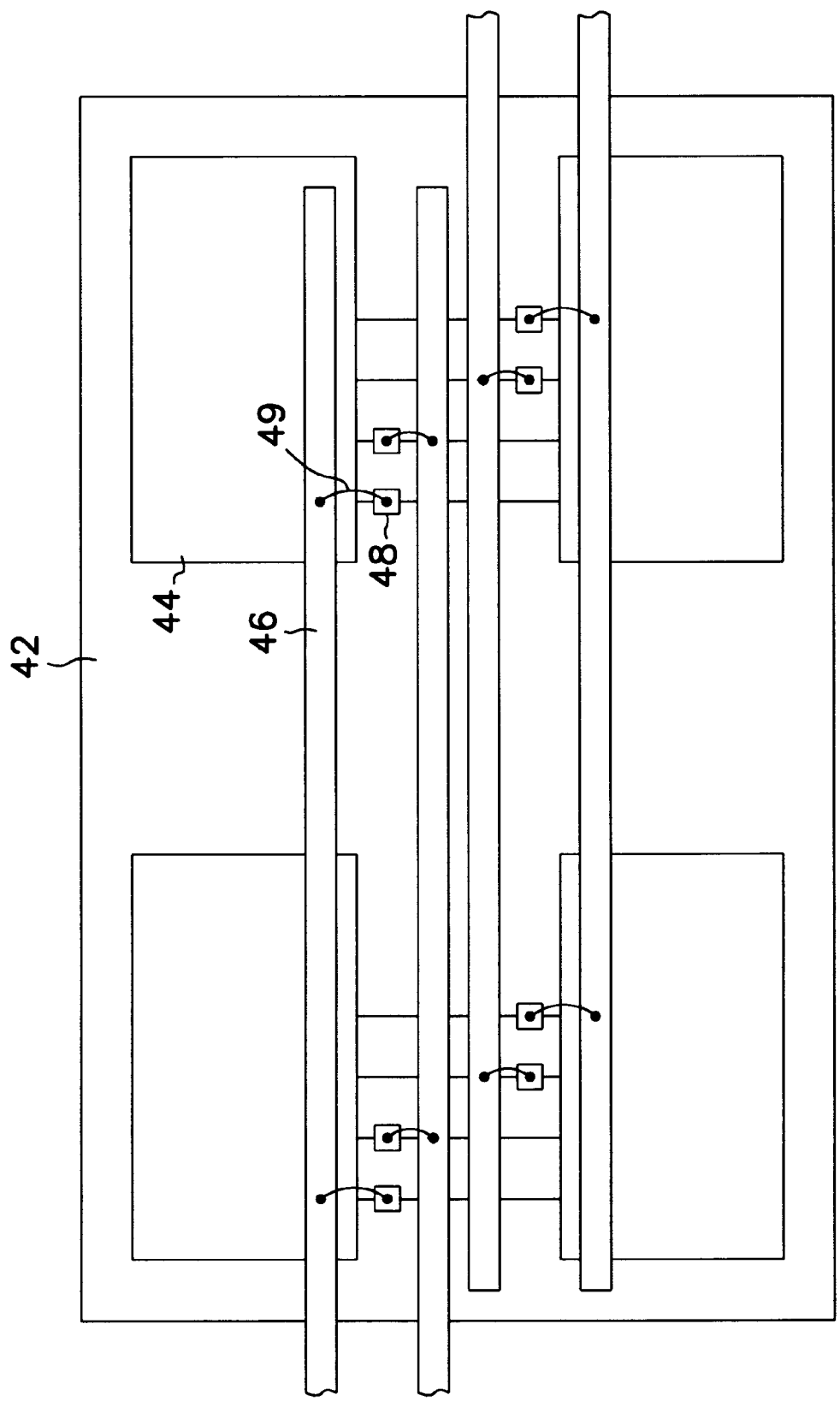
FIG. 5 is a diagram of an alternate embodiment of a memory chip and lead frame of the present invention.

Partial data bus paths can be used with multiple bond pads to reduce the parasitic capacitance experienced in the memory of FIG. 3, as illustrated in FIG. 5. Some of the sub-arrays of the memory die share a common bond pad and buffer circuitry. The data bus lines are, however, substantially reduced by using multiple bond pads per lead frame connector.

The lead frames of FIGS. 4 and 5 are intended to illustrate different types of lead frames which can be used with a distributed system. It will be appreciated by those skilled in the art that the actual layout and dimensions of a lead frame will depend upon the integrated circuit die size and layout and the desired package pin out. Further, the distributed bond pads of the present invention can be readily used with flip-chip technology. As known to those skilled in the art, packaging an integrated circuit using flip-chip technology involves the use of solder bumps placed on the die bond pads which are then bonded to a circuit board. Thus, the integrated circuit is "flipped" over during the packaging process and the data communication bond pads are connected to conductive leads formed on the circuit board. Substituting a circuit board using flipchip techniques, or other known packaging processes, in place of a lead frame can simplify the packaging of some complicated memory circuits.

Conclusion

A memory device has been described which uses an integrated circuit die having multiple distributed bond pads associated with one external data connection. A lead frame and multiple bond connections are used to electrically connect the distributed bond pads, thereby eliminating the need for lengthy data communication buses fabricated on the die. Distributed buffer circuits can be included in the memory for data communication between the memory circuit and the distributed bond pads. The integrated circuit memories, therefore, have a reduced die size which is less complex. Further, the data communication speed of the memory is increased.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of reducing data communication time in an integrated memory circuit, comprising:

fabricating an integrated memory circuit on a semiconductor die having a plurality of memory subarray circuits coupled to a plurality of data communication bond pads distributed thereon, wherein the data communication bond pads are coupled to the subarrays by buffered input/output buffer circuits;

providing a lead frame having an electrically conductive lead for bonding to the data communication bond pads; and bonding the data communication bond pads to the electrically conductive lead for bi-directional communication with an external processor.

2. The method of claim 1, wherein bonding the plurality of data communication bond pads to the electrically conductive lead comprises wire bonding the plurality of data communication bond pads to the electrically conductive lead.

3. A method of making an integrated circuit memory device, comprising:

fabricating an integrated memory chip having a memory cell array with a plurality of subarrays;

fabricating a plurality of data communication bond pads on the integrated memory chip, the data communication bond pads being coupled to the subarrays by buffered with input/output buffer circuits;

forming an electrically conductive lead for coupling to the plurality of data communication bond pads; and electrically connecting the plurality of data communication bond pads to the conductive lead.

4. A method for providing bi-directional data communication between an integrated memory circuit and an external processor, comprising:

fabricating a memory device as a semiconductor die having an array of memory cells arranged in a plurality of subarrays, the memory device having at least one electrically conductive lead;

fabricating a plurality of data communication data communication bond pads on the memory device;

electrically coupling the data communication bond pads to the at least one conductive lead so that a plurality of bond pads are connected electrically to the at least one conductive lead, wherein the data communication bond pads are coupled to the plurality of subarrays through a plurality of buffer circuits for data communication between the plurality of data communication bond pads and the plurality of subarrays.

5. A method of reducing data communication time in an integrated memory circuit, comprising:

fabricating an integrated memory circuit on a semiconductor die having a plurality of memory subarray circuits coupled to a plurality of data communication bond pads distributed thereon, wherein the data communication bond pads are coupled to the subarrays by buffered input/output buffer circuits;

providing a lead frame having an electrically conductive lead for bonding to certain of the data communication bond pads; and bonding at least two of the bond pads to the electrically conductive lead for bi-directional data communication between memory array circuits and an external processor.

6. The method of claim 5, wherein bonding the plurality of data communication bond pads to the electrically conductive lead comprises wire bonding the plurality of data communication bond pads to the electrically conductive lead.

7. A method of making an integrated circuit memory device, comprising:

fabricating an integrated memory chip having a memory cell array with a plurality of subarrays;

fabricating a plurality of data communication bond pads on the integrated memory chip, the bond pads being coupled to the subarrays by buffered with input/output buffer circuits;

forming an electrically conductive lead for coupling to the plurality of data communication bond pads; and electrically connecting at least two of the plurality of data communication bond pads to the conductive lead.

8. A method for providing bi-directional data communication between an integrated memory circuit and an external processor, comprising:

fabricating a memory device as a semiconductor die having an array of memory cells arranged in a plurality of subarrays, the memory device having at least one electrically conductive lead;

fabricating a plurality of data communication bond pads on the memory device, wherein the data communication bond pads are coupled to the plurality of subarrays through a plurality of buffer circuits for data communication between the plurality of data communication bond pads and the plurality of subarrays;

electrically coupling at least two of the data communication bond pads to the at least one conducive lead so that a plurality of bond pads are connected electrically to the at least one conductive lead.

9. A method of making an integrated circuit comprising:

fabricating an integrated circuit die having a plurality of distributed data communication connections, wherein the data communication bond pads are buffered input/output buffer circuits; and electrically connecting at least two of the plurality of distributed data communication connections to a conductive lead of an external device for bi-directional data communication between the integrated circuit and the external device.

10. A method of interconnecting a plurality of memory subarrays of an integrated memory circuit, comprising:

fabricating the an integrated memory circuit die from a plurality of sub array sections providing extended data communication leads from the subarray sections providing a plurality of data communication bond pads adjacent to the sub array sections, the bond pads coupled to the extended data communication leads, wherein the data communication bond pads are coupled to the plurality of subarray sections through a plurality of buffer circuits for data communication between the plurality of data communication bond pads and the plurality of subarray sections;

providing a lead frame having at least one conductor;

coupling at least two data communication bond pads to a lead frame conductor for providing data communication external to the memory circuit.

* * * * *

UNITED STATES PATENT AND TRADEMARK OFFICE
CERTIFICATE OF CORRECTION

PATENT NO. : 6,184,067 B1
DATED : February 6, 2001
INVENTOR(S) : Casper

It is certified that error appears in the above-identified patent and that said Letters Patent is hereby corrected as shown below:

<u>Title page,</u>
<u>Title,</u>
Delete "MEMORY DEVICE WITH MULTIPLE INPUT/OUTPUT CONNECTIONS" and insert -- METHOD OF FABRICATING A MEMORY DEVICE MULTIPLE INPUT/OUTPUT CONNECTIONS --, therefor.

<u>Abstract,</u>
Line 4, delete "a external" and insert -- an external --, therefor.

<u>Column 1,</u>
Lines 1-2, delete "MEMORY DEVICE WITH MULTIPLE INPUT/OUTPUT CONNECTIONS" and insert -- METHOD OF FABRICATING A MEMORY DEVICE MULTIPLE INPUT/OUPUT CONNECTIONS --, therefor.
Lines 64-65, delete "a" before "conductive".

<u>Column 3,</u>
Line 55, delete "integrate d" and insert -- integrated --, therefor.

<u>Column 5,</u>
Lines 29-30, delete one occurrence of "data communication".
Line 33, insert -- data communication -- before "bond pads".

<u>Column 6,</u>
Line 43, delete "the" after "fabricating".
Line 44, insert a semicolon and a paragraph break after "sections".
Line 45, insert a semicolon and a paragraph break after "sections".

Signed and Sealed this

Second Day of October, 2001

Attest:

NICHOLAS P. GODICI
Attesting Officer
Acting Director of the United States Patent and Trademark Office